US012388044B2

(12) United States Patent
Yamada et al.

(10) Patent No.: US 12,388,044 B2
(45) Date of Patent: Aug. 12, 2025

(54) AL BONDING WIRE

(71) Applicants: NIPPON MICROMETAL CORPORATION, Saitama (JP); NIPPON STEEL Chemical & Material Co., Ltd., Tokyo (JP)

(72) Inventors: Takashi Yamada, Saitama (JP); Akihito Nishibayashi, Saitama (JP); Teruo Haibara, Saitama (JP); Daizo Oda, Saitama (JP); Motoki Eto, Saitama (JP); Tetsuya Oyamada, Tokyo (JP); Takayuki Kobayashi, Tokyo (JP); Tomohiro Uno, Tokyo (JP)

(73) Assignees: NIPPON MICROMETAL CORPORATION, Saitama (JP); NIPPON STEEL Chemical & Material Co., Ltd., Tokyo (JP)

( * ) Notice: Subject to any disclaimer, the term of this patent is extended or adjusted under 35 U.S.C. 154(b) by 332 days.

(21) Appl. No.: 17/912,824

(22) PCT Filed: Mar. 25, 2020

(86) PCT No.: PCT/JP2020/013474

§ 371 (c)(1),
(2) Date: Sep. 19, 2022

(87) PCT Pub. No.: WO2021/192121

PCT Pub. Date: Sep. 30, 2021

(65) Prior Publication Data

US 2023/0142531 A1 May 11, 2023

(51) Int. Cl.
*H01L 23/00* (2006.01)

(52) U.S. Cl.
CPC .... *H01L 24/45* (2013.01); *H01L 2224/45124* (2013.01); *H01L 2224/45149* (2013.01); *H01L 2224/4516* (2013.01); *H01L 2224/45171* (2013.01)

(58) Field of Classification Search
None
See application file for complete search history.

(56) References Cited

U.S. PATENT DOCUMENTS

| | | | | |
|---|---|---|---|---|
| 12,090,578 | B2 * | 9/2024 | Yamada | H01L 24/43 |
| 2012/0118610 | A1 | 5/2012 | Terashima et al. | |
| 2012/0217060 | A1 | 8/2012 | Kusakari et al. | |
| 2013/0140084 | A1 | 6/2013 | Sarangapani et al. | |
| 2020/0017938 | A1 * | 1/2020 | Kaneko | H01L 24/45 |

FOREIGN PATENT DOCUMENTS

| | | | | | |
|---|---|---|---|---|---|
| CN | 102422404 | A | | 4/2012 | |
| CN | 102695813 | A | | 9/2012 | |
| CN | 103276255 | A | | 9/2013 | |
| CN | 103911526 | A | | 7/2014 | |
| CN | 105970035 | A | | 9/2016 | |
| CN | 110475884 | A | | 11/2019 | |
| CN | 110527864 | A | | 12/2019 | |
| EP | 2461358 | A1 | | 6/2012 | |
| EP | 3382747 | A1 | | 10/2018 | |
| EP | 3604579 | A1 | | 2/2020 | |
| GB | 2200135 | A | | 7/1988 | |
| JP | H08-008288 | A | | 1/1996 | |
| JP | 2002-314038 | A | | 10/2002 | |
| JP | 2008-311383 | A | | 12/2008 | |
| JP | 2013258324 | A | * | 12/2013 | H01L 24/43 |
| JP | 2014129578 | A | * | 7/2014 | H01L 24/43 |
| JP | 2015124409 | A | * | 7/2015 | |
| JP | 2016-108612 | A | | 6/2016 | |
| KR | 2012-0035093 | A | | 4/2012 | |
| KR | 2014-0086797 | A | | 7/2014 | |
| KR | 2019-0132346 | A | | 11/2019 | |
| TW | 201920701 | A | | 6/2019 | |

OTHER PUBLICATIONS

The First Office Action received in corresponding Chinese Patent Application No. 202080098945.5, dated Mar. 1, 2025.
Taiwanese Office Action issued in corresponding Taiwanese Application No. 109110799, dated Aug. 4, 2023 with English translation.
Extended European Search Report issued for the corresponding European patent Application No. 20926877.0 on Nov. 28, 2023.
Office Action issued for the corresponding Korean patent Application No. 10-2022-7032342 on Oct. 18, 2024.
International Search Report issued in corresponding International Patent Application No. PCT/JP2020/013474, filed Jun. 2, 2020, with English translation.
Search Report issued in the corresponding Singapore Patent Application No. 11202253125K on Mar. 7, 2025.

* cited by examiner

*Primary Examiner* — Nishath Yasmeen
(74) *Attorney, Agent, or Firm* — Rimon P.C.

(57) ABSTRACT

There is provided an Al bonding wire which can achieve a sufficient bonding reliability of bonded parts of the bonding wire under a high temperature state where a semiconductor device using the Al bonding wire is operated. The Al bonding wire is characterized in that the wire contains 0.02 to 1% by mass of Fe, further contains 0.05 to 0.5% by mass in total of at least one or more of Mn and Cr, and the balance includes Al and inevitable impurities, wherein a total content of Fe, Mn and Cr in solid solution is 0.01 to 1% by mass. The Al bonding wire contains Mn and Cr in addition to Fe, so that Fe, Mn and Cr can be promoted to form a solid solution in quenching treatment after the solution treatment. Accordingly, the Al bonding wire can achieve an effect of solid-solution strengthening of the wire due to the increase in the total content of Fe, Mn and Cr in solid solution and an effect of preventing recrystallization from proceeding during use of the semiconductor device at a high temperature for a long time.

4 Claims, No Drawings

AL BONDING WIRE

CROSS-REFERENCE OF RELATED APPLICATIONS

This application is the U.S. National Phase under 35 U.S.C. § 371 of International Patent Application No. PCT/JP2020/013474, filed on Mar. 25, 2020, the entire disclosure of which Application is incorporated by reference herein.

TECHNICAL FIELD

The present invention relates to an Al bonding wire.

BACKGROUND ART

In a semiconductor device, electrodes formed on a semiconductor element are connected with lead frames or electrodes on a substrate using a bonding wire. As for a material of the bonding wire, gold (Au) and copper (Cu) are used for an integrated circuit semiconductor device such as an ultra-LSI, while aluminum (Al) is mainly used for a power semiconductor device. For example, Patent Literature 1 discloses an example in which an aluminum bonding wire (hereinafter referred to as an "Al bonding wire") with a diameter of 300 μm is used in a power semiconductor module. In a power semiconductor device using an Al bonding wire, a wedge bonding is used as a bonding process for both of the connection with electrodes on semiconductor element and the connection with lead frames or electrodes on substrate.

A power semiconductor device using an Al bonding wire is often used as a semiconductor device for large power equipment such as air conditioner and photovoltaic power generation system, and for automotive. In these semiconductor devices, the bonded parts of Al bonding wire are exposed to high temperatures of 100 to 150° C. Since an Al bonding wire composed only of high purity Al tends to soften in such a high temperature environment, it is difficult to use such Al bonding wire in a high temperature environment.

Patent Literature 2 discloses an Al wire containing 0.02 to 1% by weight of Fe. In Al wires not containing Fe, recrystallization occurs just above the wire bonding interface at high temperature during use of the semiconductor, and forms small crystal grains, which causes cracking. On the other hand, the recrystallization temperature can be increased if the wire contains 0.02% or more of Fe. By annealing after wire-drawing, the wire crystal grain size before bonding is set to be 50 μm or more. It is described that there will be no occurrence of cracks since the crystal grain size is large and the recrystallization does not occur even at high temperature during use of the semiconductors.

In Working Example 3 of Patent Literature 3, there is disclosed a wire having a diameter of 300 μm which is manufactured by preparing an alloy ingot in which 0.2 wt % of Fe is added to 99.99 wt % (4N) of high-purity Al, annealing the ingot at 300° C. for 30 minutes after wire-drawing processing, and slowly cooling the ingot to remove the processing strain and soften the ingot. It is described that, by aging the wire for 1 minute to 1 hour at 100 to 200° C. after bonding, cracks caused at a connection part can be prevented from proceeding even when repeatedly applying a large current during use at a maximum operation temperature of 200° C.

Patent Literature 4 discloses a bonding wire containing 0.2 to 2.0% by mass of iron (Fe) with the balance consisting of aluminum (Al) having a purity of 99.99% or more, in which 0.01 to 0.05% of Fe forms a solid solution in an Al matrix, and a wire-drawing matrix structure is a uniform fine recrystallized structure of several μm order where Fe—Al intermetallic compound particles are uniformly crystallized. It is described that: by adding the solution treatment and the quenching treatment before the thermal refining heat treatment, the content of Fe in solid solution is increased up to 0.052% that is a solid-solubility limit at 650° C.; subsequently, by performing the wire-drawing processing and the thermal refining heat treatment, a crystal grain size is made finer; and by using the high-purity Al, the dynamic recrystallization is caused at the time of bonding to avoid chip damage. Further, Patent Literature 5 discloses an aluminum alloy thin line containing 0.01 to 0.2% by mass of Fe and 1 to 20 ppm by mass of Si with the balance consisting of Al having a purity of 99.997% by mass or more, in which the content of Fe in solid solution is 0.01 to 0.06%, the content of Fe in precipitates is seven times or less compared to the content of Fe in solid solution, and the aluminum alloy thin line has a fine structure having an average crystal grain size of 6 to 12 μm. It is described that: by suppressing the content of Fe to keep a ratio between the content of Fe in precipitates and the content of Fe in solid solution into a certain range, the recrystallization temperature is stabilized; and further, by adding a minute amount of Si, the strength is improved. Accordingly, the aluminum alloy thin line can achieve the stable results in the thermal shock test.

RELATED ART REFERENCE

Patent Literature

Patent Literature 1: JP-A-2002-314038
Patent Literature 2: JP-A-H8-8288
Patent Literature 3: JP-A-2008-311383
Patent Literature 4: JP-A-2013-258324
Patent Literature 5: JP-A-2014-129578

SUMMARY OF INVENTION

Problem to be Solved by the Invention

Even for the semiconductor device using the Al bonding wire containing Fe as described in Patent Literatures 2 to 5, sufficient bonding reliability of the bonded parts of the bonding wire was sometimes not achieved under a high temperature state where the semiconductor device was operated.

An object of the present invention is to provide an Al bonding wire which achieves sufficient bonding reliability of bonded parts of the bonding wire under a high temperature state where a semiconductor device using the Al bonding wire is operated.

Means for Solving Problem

Specifically, the summary of the present invention is as follows.

[1] An Al bonding wire comprising 0.02 to 1% by mass of Fe and further 0.05 to 0.5% by mass in total of at least one or more of Mn and Cr, with the balance comprising Al and inevitable impurities, wherein
a total content of Fe, Mn and Cr in solid solution is 0.01 to 1% by mass.

[2] The Al bonding wire according to [1], wherein an average crystal grain size in a cross-section perpendicular to a wire longitudinal direction is 0.1 to 50 μm.

[3] The Al bonding wire according to [1] or [2], wherein in a cross-section perpendicular to a wire longitudinal direction, an area ratio of a crystal having a crystal orientation <111> angled at 15 degrees or less to a wire longitudinal direction is 30 to 90%.

[4] The Al bonding wire according to any one of [1] to [3], wherein the Vickers hardness of the wire falls within a range from Hv20 to 40.

[5] The Al bonding wire according to any one [1] to [4], wherein a wire diameter is 50 to 600 μm.

Effect of the Invention

The Al bonding wire of the present invention contains 0.02 to 1% by mass of Fe and further 0.05 to 0.5% by mass in total of at least one or more of Mn and Cr, and the balance includes Al and inevitable impurities, in which a total content of Fe, Mn and Cr in solid solution is 0.01 to 1% by mass. Accordingly, The Al bonding wire of the present invention can achieve sufficient bonding reliability of bonded parts of the bonding wire under a high temperature state where a semiconductor device using the Al bonding wire is operated.

EMBODIMENT FOR CARRYING OUT THE INVENTION

In the inventions disclosed in Patent Literatures 4 and 5, as a result of the fact that Fe is contained in the Al bonding wire and further the content of Fe in solid solution in the wire is increased by the solution heat treatment and the subsequent quenching treatment during manufacture of the wire, the strength of the wire is increased and a recrystallization temperature is increased, and thus, the recrystallization is prevented from proceeding during use at a high temperature and the wire strength can be maintained.

However, even for the semiconductor device including the Al bonding wire in which Fe is contained and the content of Fe in solid solution is increased, when the semiconductor device is operated for a long time under a high temperature state, there was observed a phenomenon in which the bonding strength of bonded parts of the bonding wire decreased. In other words, it was found that sufficient bonding reliability cannot be achieved. According to the observation of the cross-section of the bonding wire in the semiconductor device after long-term operation under a high temperature, it was found that the crystal grain size of the wire is increased as compared with that at the time of bonding. It is therefore inferred that the recrystallization of the wire has further proceeded due to long-term operation under a high temperature, resulting in a decrease in the wire strength and the reliability of the bonded parts.

In contrast, the Al bonding wire of the present invention contains a predetermined amount of one or both of Mn and Cr in addition to Fe, so that the total content of Fe, Mn and Cr in solid solution is 0.01 to 1% by performing the solution heat treatment and the subsequent quenching treatment. Thus, the recrystallization temperature of the wire is increased, so that even when the semiconductor device is continuously operated for a long time under a high temperature environment, the proceeding of recrystallization of the bonding wire can be sufficiently suppressed and the strength of the wire can be prevented from being decreased. A detailed description will next be given.

There will be described an evaluation test of reliability of the bonded parts after a high-temperature long-term hysteresis.

As a bonding wire, an Al bonding wire of a comparative example that contains only 0.5% by mass of Fe, and an Al bonding wire of the present invention that contains 0.5% of Fe and 0.5% of Mn were used. The wire diameter after wire-drawing was 200 μm. In the middle of the wire-drawing processing, the solution heat treatment and the subsequent quenching treatment were performed such that the content of Fe and Mn in solid solution was increased, and the thermal refining heat treatment was performed on the wire after wire-drawing to adjust the Vickers hardness of the bonding wire to be Hv40 or less. An average crystal grain size of the wire was about 10 μm in both cases.

The total content (% by mass) of Fe, Mn and Cr in solid solution in the wire was evaluated by a residual resistance ratio (RRR). The residual resistance ratio is a ratio $\rho_{293K}/\rho_{4K}$ of an electric resistance $\rho_{293K}$ at a room temperature (293 K) to an electric resistance $\rho_{4K}$ at a liquid helium temperature (4 K). The electric resistance $\rho_{4K}$ at the liquid helium temperature (4 K) is lowered as the content of impurities in solid solution is smaller, so that the residual resistance ratio (RRR) becomes large. In this way, the electric resistance in a superconducting state varies depending on the content of impurities, and thus, the total content (% by mass) of Fe, M, and Cr in solid solution in aluminum can be calculated based on the value reflecting the content in solid solution. In the Al bonding wire of the comparative example, the content of Fe in solid solution was 0.005 to 0.009%. On the other hand, in the Al bonding wire of the present invention, the total content of Fe and Mn was 0.02 to 0.94%. The residual resistance ratio (RRR) can be calculated by measuring the electric resistance $\rho_{293K}$ at the room temperature (293 K) and the electric resistance $\rho_{4K}$ at the liquid helium temperature (4 K) by using a four-terminal method.

In the semiconductor device, both the first bonded part between the semiconductor chip and the bonding wire and the second bonded part between the external terminal and the bonding wire utilized wedge bonding.

The high-temperature long-term hysteresis was performed by power cycle test. The power cycle test involves repeatedly heating and cooling the semiconductor device in which the Al bonding wires are bonded. Specifically, the semiconductor device is heated over 2 seconds until the temperature of the bonded parts of the bonding wires in the semiconductor device becomes 140° C., and then is cooled over 5 seconds until the temperature of the bonded parts becomes 30° C. This heating and cooling cycle is repeated 200,000 times.

After performing the high-temperature long-term hysteresis as noted above, the bond shear force of the first bonded part was measured to evaluate the reliability of the bonded parts. As a result, regarding the Al bonding wire only containing 0.5% by mass of Fe, the bond shear force was less than 50% compared to the initial shear force, and the reliability of the bonded parts was insufficient. In contrast, regarding the Al bonding wire of the present invention containing 0.5% of Fe and 0.5% of Mn, the bond shear force was 90% or more compared to the initial shear force, so that the sufficient reliability of the bonded parts could be ensured.

According to the observation on crystals of the cross-section of the wire after the high-temperature long-term hysteresis described above, the average crystal grain size was maintained to be 50 μm or less for the Al bonding wire of the present invention containing 0.5% of Fe and 0.5% of Mn, and on the other hand, the average crystal grain size exceeded 50 μm for the Al bonding wire of the comparative example only containing 0.5% by mass of Fe. It can be considered that, in the wire of the present invention which contained both of Fe and Mn and as a result the total content of Fe and Mn in solid solution was 0.01% or more, the recrystallization temperature was high, and recrystallization did not proceed even after the high-temperature long-term hysteresis. On the other hand, it can be considered that, in the wire of the comparative example which contained only Fe and as a result the content of Fe in solid solution was smaller than 0.01%, the recrystallization temperature was low, and the recrystallization proceeded in the high-temperature long-term hysteresis and the strength of the wire was decreased, so that the reliability of the bonded parts could not be sufficiently secured.

There will be described the composition of the bonding wire of the present invention. In the description, "%" means "% by mass".

<<0.02 to 1% of Fe>>

When the Al bonding wire contains 0.02% or more of Fe, an effect of solid-solution strengthening of the wire due to increase in the total content of Fe, Mn and Cr in solid solution and an effect of preventing recrystallization from proceeding during use of the semiconductor device at a high temperature for a long time can be achieved, in combination with a composite additive effect with Mn and Cr described below. The content of Fe is more preferably 0.1% or more, further preferably 0.3% or more, and further more preferably 0.5% or more. On the other hand, if the content of Fe exceeds 1%, the hardness of the wire becomes too high, so that a chip crack is caused, a bonding quality is deteriorated, and the reliability of the bonded parts is deteriorated, for example. Thus, an upper limit of the content of Fe is set to be 1%. The content of Fe is more preferably 0.8% or less.

<<0.05 to 0.5% in Total of at Least One or More of Mn and Cr>>

When the Al bonding wire contains 0.05% or more in total of at least one or more of Mn and Cr, the effect of solid-solution strengthening of the wire due to increase in the total content of Fe, Mn and Cr in solid solution and the effect of preventing recrystallization from proceeding during use of the semiconductor device at a high temperature for a Long time can be achieved, in combination with the composite additive effect with Fe as described above. Any of Mn and Cr achieves the same effects. The total content of Mn and Cr is more preferably 0.1% or more, further preferably 0.3% or more. On the other hand, if the total content of Mn and Cr exceeds 0.5%, the hardness of the wire becomes too high, so that a chip crack is caused, the bonding quality is deteriorated, and the reliability of the bonded parts is deteriorated, for example. Thus, an upper limit of the total content is set to be 0.5%. The total content of Mn and Cr is more preferably 0.4% or less.

For analyzing the content of Fe, Mn and Cr in the bonding wire, an ICP emission spectroscopic analysis device and an ICP mass spectroscopic device can be used. The contents of Fe, Mn and Cr described in the present invention are based on concentration measured by ICP emission spectroscopic analysis or ICP mass spectroscopy.

The balance, the remaining part, of the bonding wire may consist of Al and inevitable impurities. Examples of elements of the inevitable impurities may include Si and Cu. A total content of the inevitable impurities is preferably small because variation in material characteristics can be suppressed to be small. By using aluminum having a purity of 4N (Al: 99.99% or more) as an aluminum raw material for manufacturing the wire, a favorable result can be obtained.

<<0.01 to 1% of Total Content of Fe, Mn and Cr in Solid Solution>>

When a total content of Fe, Mn and Cr in solid solution is 0.01% or more, the recrystallization temperature of the wire can be sufficiently increased. As a result, there can be achieved the effect of preventing recrystallization from proceeding during use of the semiconductor device at a high temperature for a long time. The total content of Fe, Mn and Cr in solid solution is more preferably 0.02% or more, further preferably 0.03% or more or 0.05% or more, and further more preferably 0.1% or more, 0.3% or more, or 0.5% or more. On the other hand, if the total content of Fe, Mn and Cr in solid solution exceeds 1%, the hardness of the wire becomes too high, so that a chip crack is caused, or the bonding quality is deteriorated, for example. Thus, an upper limit thereof is set to be 1%. The total content of Fe, Mn and Cr in solid solution is more preferably 0.9% or less, further preferably 0.8% or less. The content of Fe in precipitates can be calculated by subtracting the content of Fe in solid solution from the content of Fe.

<<Average Crystal Grain Size of Wire>>

In a preferable embodiment of the present invention, the average crystal grain size is 0.1 to 50 μm in the cross-section (C cross-section) perpendicular to a wire longitudinal direction of the bonding wire. As for a measuring method of the average crystal grain size, a measuring method such as EBSD (Electron Back Scatter Diffraction Patterns) is used to determine the area of each crystal grain, and then to convert the area of each crystal grain into the area of a circle, and to calculate the average diameters of the converted circles. When the average crystal grain size is 0.1 μm or more, recrystallization by the thermal refining heat treatment at the time of wire-drawing has moderately proceeded, so that the wire is softened, in combination with the fact that components contained in the wire are enforced to form a solid solution by performing the solution heat treatment in the process of manufacturing the wire. Accordingly, a chip crack can be prevented from being caused at the time of bonding, and the bonding quality of the bonded parts can be prevented from being deteriorated, for example. On the other hand, if the average crystal grain size exceeds 50 μm, it indicates that recrystallization of the wire has excessively proceeded. Thus, it is difficult to obtain sufficient strength. By performing the thermal refining heat treatment in the process of wire-drawing, the average crystal grain size in the C cross-section of the wire can be 0.1 to 50 μm.

<<Area Ratio of Orientation <111> of Wire>>

In a preferable embodiment of the present invention, in the cross-section (C cross-section) perpendicular to the longitudinal direction of the bonding wire, an area ratio of a crystal having a crystal orientation <111> angled at 15 degrees or less to a wire longitudinal direction (hereinafter, referred to as "area ratio of orientation <111>") is 30 to 90%. For the measurement of the area ratio of orientation <111>, EBSD can be used. The area ratio of orientation <111> can be calculated by inspecting the cross-section perpendicular to the longitudinal direction of the bonding wire as an inspection surface, and using an analysis software dedicated to the measuring device. In the process of determining the area ratio of orientation <111>, there is excluded a portion where crystal orientation cannot be measured or a portion where the reliability of orientation analysis is low even when crystal orientation can be measured. When the area ratio of orientation <111> is 90% or less, recrystallization by the thermal refining heat treatment at the time of wire-drawing has moderately proceeded, so that the wire is softened, and a chip crack can be prevented from being caused at the time of bonding, and the bonding quality of the bonded parts can be prevented from being deteriorated, for example. On the other hand, if the area ratio of orientation <111> is less than 30%, it indicates that recrystallization of the wire has excessively proceeded. Thus, it is difficult to obtain sufficient strength. By performing the thermal refining heat treatment in the process of wire-drawing, the area ratio of orientation <111> in a cross-section perpendicular to the wire longitudinal direction can be 30 to 90%.

<<Vickers Hardness of Wire>>

In a preferable embodiment of the present invention, the Vickers hardness in the cross-section (C cross-section) perpendicular to the wire longitudinal direction of the bonding wire falls within a range from Hv20 to 40. When the Vickers hardness is Hv40 or less, a favorable bonding property can be achieved without generating a chip crack during bonding. In addition, loops can be easily formed to provide wiring to the semiconductor device. On the other hand, the Vickers hardness of less than Hv20 indicates that the recrystallization of the wire has excessively proceeded. Thus, it is difficult to obtain sufficient strength. Therefore, the lower limit of the Vickers hardness is preferably Hv20. As described above, by performing the solution heat treatment and the quenching treatment in the process of manufacturing the wire such that the total content of Fe, Mn and Cr in solid solution is increased, and further performing the thermal refining heat treatment in the process of wire-drawing, the Vickers hardness of the wire can fall within the range from Hv20 to 40.

<<Wire Diameter>>

In a preferable embodiment of the present invention, the diameter of the bonding wire is 50 to 600 μm. Wires with diameter of 50 μm or more are generally used for power system devices due to a large current flow. Wires with diameter exceeding 600 μm are difficult to handle and no wire bonders are available for them. Thus, wires with diameter of 600 μm or less are used.

<Method for Manufacturing Bonding Wire>

The bonding wire of the present invention is manufactured by obtaining an Al alloy containing predetermined components, followed by performing the rolling and wire drawing as the common procedure.

In the middle of manufacture, the solution heat treatment and the subsequent quenching treatment are performed. The solution heat treatment can be performed at a stage where a wire diameter is about 1 mm. The condition for the solution heat treatment is preferably 570 to 640° C. for 1 to 3 hours. The quenching treatment after the solution heat treatment is preferably quenching, rapid cooling, in water. Thus, the total content of Fe, Mn and Cr in solid solution can fall within a range of the present invention, in combination with the fact that the contents of Fe and one or both of Mn and Cr in Al fall within a range of the present invention.

The thermal refining heat treatment is performed during and/or after the wire-drawing. It is possible to increase the average crystal grain size, to reduce the ratio of orientation <111>, and to reduce the Vickers hardness by increasing the temperature of the thermal refining heat treatment and extending the time thereof. The condition of the thermal refining heat treatment can be determined within a range of 250 to 350° C. for the heat treatment temperature and within a range of 2 to 4 hours for the heat treatment time so as to realize a preferable average crystal grain size, ratio of orientation <111>, and Vickers hardness.

EXAMPLES

Aluminum having a purity of 99.99% by mass or more (4N), and Fe, Mn and Cr having a purity of 99.9% by mass or more were molten as raw materials, and an Al alloy having a composition indicated in Table 1 was obtained. This alloy was used as an ingot, the ingot was subjected to rolling with a groove roll, and was further subjected to wire-drawing processing. At a stage where the wire diameter was 800 μm, the wire was subjected to the solution heat treatment at 620° C. for 3 hours, and was cooled. Cooling conditions were two types, that is, quenching (water cooling) and slow cooling (air cooling). Thereafter, the wire-drawing processing using dies was performed to achieve a final wire diameter of 200 μm. After the wire-drawing processing ended, the thermal refining heat treatment was performed at 270° C. for 10 seconds.

The contents of Fe, Mn and Cr in the wire were analyzed by using ICP (emission spectroscopic analysis). The total content (% by mass) of Fe, Mn and Cr in solid solution in the wire was evaluated by the residual resistance ratio (RRR).

For the resultant wires, an average crystal grain size, an area ratio of a crystal having a crystal orientation <111> angled at 15 degrees or less to a wire longitudinal direction (the area ratio of orientation <111>), and the Vickers hardness were measured on a cross-section perpendicular to the wire longitudinal direction.

The average crystal grain size was measured by determining the area of each crystal grain using an EBSD method and then calculating the average of diameter of each crystal grain on the supposition that each crystal grain is a circle.

The measurement of the area ratio of orientation <111> was performed by measuring with EBSD on a cross-section perpendicular to the longitudinal direction of the bonding wire, and calculating the area ratio of orientation <111> using the analysis software dedicated to the measuring device.

The Vickers hardness was measured as the hardness of the C cross-section, specifically, the hardness of the center position of the C cross-section in radial direction.

In the semiconductor device, the electrode on the semiconductor chip was Al—Cu, and the external terminal was Ag. Both the first bonded parts between the electrode on the semiconductor chip and the bonding wire and the second bonded parts between the external terminal and the bonding wire utilized wedge bonding.

The bonding property of the bonding wire in the semiconductor device was evaluated by the presence or absence of initial bonding failure (before a high-temperature long-term hysteresis) of the first bonded parts. In the evaluation, a case being bonded was marked with a symbol of "circle", and a case being not bonded was marked with a symbol of "cross" in the column "bonding property" in Table 1.

The evaluation of chip crack in the semiconductor device was performed by dissolving metal of the pad surface with an acid, and observing the presence or absence of chip cracks under the pad using a microscope. In the evaluation, no presence of cracks was marked with a symbol of "circle", some presence of cracks was marked with a symbol of "cross" in the column "chip crack" in Table 1.

The high-temperature long-term hysteresis was performed by a power cycle test. The power cycle test involved repeatedly heating and cooling the semiconductor device in which an Al bonding wire had been bonded. Specifically, the semiconductor device was heated over 2 seconds until the temperature of the bonded parts of the bonding wires in the semiconductor device became 140° C., and then was cooled over 5 seconds until the temperature of the bonded parts became 30° C. This heating and cooling cycle was repeated 200,000 times.

After performing the high-temperature long-term hysteresis, the bond shear force of the first bonded part was measured to evaluate the reliability of the bonded part. The shear force was measured as a comparison with the initial shear force of the bonded part. In the evaluation, the shear force being 95% or more of the initial bond shear force was marked with a symbol of "double circle", being 90% or more and less than 95% of the initial bond shear force was marked with a symbol of "circle", being 50% or more and less than 90% of the initial bond shear force was marked with a symbol of "triangle", and being less than 50% of the initial bond shear force was marked with a symbol of "cross" in the column "reliability test" in Table 1.

Manufacturing conditions and manufacturing results are shown in Table 1. Mn and Cr are indicated as "second components". In Table 1, underlined are values of component contents outside the range of the present invention and values of evaluation results outside the preferred range of the present invention.

Working Example Nos. 1 to 18 in Table 1 are examples of the present invention. In these examples, quenching was performed after the solution treatment. In these examples, a component content of the wire and a total content of Fe, Mn and Cr in solid solution fell within the range of the present invention, all of the average crystal grain size, the area ratio of orientation <111>, and the Vickers hardness of the wire fell within the preferred range of the present invention, and the evaluation results of the bonding property and the chip crack were all "circle". This resulted from the fact that the components defined in the present invention were contained in the wire, a ratio of the content Fe in precipitates to the content of Fe in solid solution was lowered by performing the solution heat treatment and the quenching treatment, and recrystallization were moderately proceeded by the thermal refining heat treatment.

In Working Example Nos. 1 to 18, the evaluation results of the reliability of the bonded parts after the high-temperature long-term hysteresis were all "circle" or "double circle". This resulted from the fact that the wire was solid-solution strengthened and the recrystallization temperature thereof was increased to prevent recrystallization from proceeding in the high-temperature long-term hysteresis, because the wire contained the components defined in the present invention and satisfied the total content of Fe, Mn and Cr in solid solution defined in the present invention. Particularly, in Working Example Nos. 7 to 12, the content of Fe fell within the preferred range of the present invention, and the evaluation results of the reliability of the bonded parts were all "double circle".

TABLE 1

| | | Component content (% by mass) | | | | Cooling after solution heat treatment | Total content of Fe, Mn, Cr in solid solution | Wire properties | | | Performance in use | | |
|---|---|---|---|---|---|---|---|---|---|---|---|---|---|
| | | | Second components | | | | | Crystal grain size | Orientation <111> ratio | Hardness | Bonding | Chip | Reliability |
| | No. | Fe | Mn | Cr | Total | treatment | (% by mass) | (μm) | (%) | Hv | property | crack | test |
| Working Example | 1 | 0.02 | 0.05 | 0 | 0.05 | Quenching | 0.02 | 49 | 57 | 27 | ○ | ○ | ○ |
| | 2 | 0.02 | 0 | 0.05 | 0.05 | " | 0.02 | 40 | 58 | 25 | ○ | ○ | ○ |
| | 3 | 0.02 | 0.025 | 0.025 | 0.05 | " | 0.03 | 50 | 57 | 24 | ○ | ○ | ○ |
| | 4 | 0.02 | 0.5 | 0 | 0.5 | " | 0.05 | 28 | 70 | 28 | ○ | ○ | ○ |
| | 5 | 0.02 | 0 | 0.5 | 0.5 | " | 0.04 | 33 | 68 | 28 | ○ | ○ | ○ |
| | 6 | 0.02 | 0.25 | 0.25 | 0.5 | " | 0.04 | 35 | 69 | 31 | ○ | ○ | ○ |
| | 7 | 0.5 | 0.05 | 0 | 0.05 | " | 0.07 | 15 | 71 | 27 | ○ | ○ | ◎ |
| | 8 | 0.5 | 0 | 0.05 | 0.05 | " | 0.08 | 15 | 69 | 27 | ○ | ○ | ◎ |
| | 9 | 0.5 | 0.025 | 0.025 | 0.05 | " | 0.06 | 14 | 72 | 29 | ○ | ○ | ◎ |
| | 10 | 0.5 | 0.5 | 0 | 0.5 | " | 0.09 | 9 | 74 | 33 | ○ | ○ | ◎ |
| | 11 | 0.5 | 0 | 0.5 | 0.5 | " | 0.09 | 3 | 74 | 32 | ○ | ○ | ◎ |
| | 12 | 0.5 | 0.25 | 0.25 | 0.5 | " | 0.10 | 6 | 73 | 31 | ○ | ○ | ◎ |
| | 13 | 1.0 | 0.05 | 0 | 0.05 | " | 0.33 | 1.7 | 75 | 35 | ○ | ○ | ○ |
| | 14 | 1.0 | 0 | 0.05 | 0.05 | " | 0.25 | 1.1 | 73 | 36 | ○ | ○ | ○ |
| | 15 | 1.0 | 0.025 | 0.025 | 0.05 | " | 0.47 | 1.1 | 77 | 33 | ○ | ○ | ○ |
| | 16 | 1.0 | 0.5 | 0 | 0.5 | " | 0.63 | 0.3 | 87 | 36 | ○ | ○ | ○ |
| | 17 | 1.0 | 0 | 0.5 | 0.5 | " | 0.94 | 0.2 | 86 | 39 | ○ | ○ | ○ |
| | 18 | 1.0 | 0.25 | 0.25 | 0.5 | " | 0.54 | 1.0 | 86 | 35 | ○ | ○ | ○ |
| Comparative Example | 1 | 0.01 | 0 | 0 | 0 | Quenching | 0.005 | 27 | 60 | 17 | ○ | ○ | X |
| | 2 | 0.01 | 0.3 | 0 | 0.3 | " | 0.001 | 13 | 59 | 18 | ○ | ○ | X |
| | 3 | 0.01 | 0.8 | 0 | 0.8 | " | 0.001 | 14 | 56 | 19 | ○ | ○ | X |
| | 4 | 0.5 | 0 | 0 | 0 | " | 0.009 | 14 | 69 | 18 | ○ | ○ | X |
| | 5 | 0.5 | 0.01 | 0 | 0.01 | " | 0.008 | 6 | 69 | 18 | ○ | ○ | X |
| | 6 | 0.5 | 0.8 | 0 | 0.8 | " | 0.009 | 13 | 71 | 41 | X | X | X |
| | 7 | 1.5 | 0 | 0 | 0 | " | 1.22 | 0.3 | 84 | 44 | X | X | X |
| | 8 | 1.5 | 0.01 | 0 | 0.01 | " | 1.18 | 0.8 | 83 | 43 | X | X | X |
| | 9 | 1.5 | 0.3 | 0 | 0.3 | " | 1.26 | 0.9 | 83 | 44 | X | X | X |
| | 10 | 1.5 | 0.8 | 0 | 0.8 | " | 1.17 | 0.09 | 93 | 47 | X | X | X |
| | 11 | 0.02 | 0.05 | 0 | 0.05 | Slow cooling | 0.005 | 15 | 58 | 15 | ○ | ○ | X |
| | 12 | 0.5 | 0.05 | 0 | 0.05 | " | 0.006 | 10 | 71 | 17 | ○ | ○ | X |
| | 13 | 1.0 | 0.05 | 0 | 0.05 | " | 0.009 | 2 | 78 | 18 | ○ | ○ | X |

Comparative Example Nos. 1 to 13 in Table 1 are comparative examples. The cooling condition after the solution treatment is quenching in Comparative Examples 1 to 10, and slow cooling in Comparative Examples 11 to 13.

In Comparative Example Nos. 1 to 3, the content of Fe was less than a lower limit of the present invention. In Comparative Example No. 1, the total content of Mn and Cr was less than a lower limit of the present invention. In Comparative Example 3, the total content of Mn and Cr exceeded an upper Limit of the present invention. The evaluation result of the reliability was "cross" in all of Comparative Example Nos. 1 to 3. As a result of evaluating inner quality of the wire after the high-temperature long-term hysteresis, the average crystal grain size exceeded 50 μm in all of Comparative Example Nos. 1 to 3. As a reason for that, it is estimated that Fe in the wire was insufficient, the recrystallization temperature was not sufficiently increased, and recrystallization has excessively proceeded in the high-temperature long-term hysteresis.

In Comparative Example Nos. 4 and 5, the total content of Mn and Cr was less than a lower limit of the present invention, and the total content of Fe, Mn and Cr in solid solution was less than 0.01%. The evaluation result of the reliability was "cross" in both of Comparative Example Nos. 4 and 5. As a result of evaluating the inner quality of the wire after the high-temperature long-term hysteresis, the average crystal grain size exceeded 50 μm in both of Comparative Example Nos. 4 and 5. As a reason for that, it is estimated that the total content of Mn and Cr in the wire was insufficient, the total content of Fe, Mn and Cr in solid solution could not be adjusted to be 0.01% or more even after the solution treatment and the quenching treatment were performed, the recrystallization temperature was not sufficiently increased, and recrystallization has excessively proceeded in the high-temperature long-term hysteresis.

In Comparative Example No. 6, the total content of Mn and Cr exceeded the upper limit of the present invention. As a result, the Vickers hardness of the wire was out of an upper limit of a preferred range. Both of the bonding property and the chip crack after bonding were "cross", and the evaluation result of the reliability was "cross".

In Comparative Example Nos. 7 to 10, the content of Fe exceeded the upper limit of the present invention. Additionally, the total content of Mn and Cr was less than the lower limit of the present invention in Comparative Example Nos. 7 and 8, and the total content of Mn and Cr exceeded the upper limit of the present invention in Comparative Example No. 10. In all of Comparative Example Nos. 7 to 10, the content of Fe exceeded the upper limit of the present invention, so that the Vickers hardness was out of a preferred upper limit of the present invention. In Comparative Example No. 10, the total content of Mn and Cr also exceeded the upper limit, so that Mn and Cr failed to sufficiently form a solid solution and were precipitated even when they were enforced to form a solid solution. Accordingly, the average crystal grain size was smaller than a preferred lower limit of the present invention, and the area ratio of orientation <111> was out of a preferred upper limit of the present invention. As a result, both of the bonding property and the chip crack were "cross", and the evaluation results of the reliability of the bonded parts after the high-temperature long-term hysteresis were "cross" in all of Comparative Example Nos. 7 to 10.

In Comparative Example Nos. 11 to 13, a component content fell within a range of the present invention, but the cooling condition after the solution treatment at the time of manufacture was "slow cooling". As a result, Fe and Mn in the wire failed to sufficiently form a solid solution, and the total content of Fe, Mn and Cr in solid solution was less than 0.01%. The hardness of the wire was also smaller than a lower limit of a preferred range. The evaluation result of the reliability was "cross" in all of Comparative Example Nos. 11 to 13. As a result of evaluating the inner quality of the wire after the high-temperature long-term hysteresis, the average crystal grain size exceeded 50 μm in all of Comparative Example Nos. 11 to 13. As a reason for that, it is estimated that the total content of Fe, Mn and Cr in solid solution could not be adjusted to 0.01% or more, so that the recrystallization temperature was not sufficiently increased, and recrystallization has excessively proceeded in the high-temperature long-term hysteresis.

The invention claimed is:

1. An Al bonding wire consisting of 0.02 to 1% by mass of Fe and further 0.05 to 0.5% by mass in total of at least one or more of Mn and Cr, with the balance consisting of Al and inevitable impurities, wherein a total content of Fe, Mn and Cr in solid solution is 0.01 to 1% by mass, and in a cross-section perpendicular to a wire longitudinal direction, an area ratio of a crystal having a crystal orientation <111> angled at 15 degrees or less to the wire longitudinal direction is 30 to 90%.

2. The Al bonding wire according to claim 1, wherein an average crystal grain size in a cross-section perpendicular to the wire longitudinal direction is 0.1 to 50 um.

3. The Al bonding wire according to claim 1, wherein the Vickers hardness of the wire falls within a range from Hv20 to 40.

4. The Al bonding wire according to claim 1, wherein the wire diameter is 50 to 600 um.

* * * * *